(12) United States Patent (10) Patent No.: US 12,617,057 B2

Nakano (45) Date of Patent: May 5, 2026

(54) METHOD OF CREATING CORRELATION RELATIONAL FORMULA FOR DETERMINING POLISHING CONDITION, METHOD OF DETERMINING POLISHING CONDITION, AND SEMICONDUCTOR WAFER MANUFACTURING METHOD

(71) Applicant: SUMCO CORPORATION, Tokyo (JP)

(72) Inventor: Yuki Nakano, Saga (JP)

(73) Assignee: SUMCO CORPORATION, Tokyo (JP)

( * ) Notice: Subject to any disclaimer, the term of this patent is extended or adjusted under 35 U.S.C. 154(b) by 387 days.

(21) Appl. No.: 18/289,924

(22) PCT Filed: Feb. 28, 2022

(86) PCT No.: PCT/JP2022/008115

§ 371 (c)(1),
(2) Date: Nov. 8, 2023

(87) PCT Pub. No.: WO2022/239376

PCT Pub. Date: Nov. 17, 2022

(65) Prior Publication Data

US 2024/0246191 A1 Jul. 25, 2024

(30) Foreign Application Priority Data

May 10, 2021 (JP) ................................. 2021-079616

(51) Int. Cl.
*B24B 37/013* (2012.01)
*B24B 37/015* (2012.01)
*H10P 74/00* (2026.01)

(52) U.S. Cl.
CPC .......... *B24B 37/013* (2013.01); *B24B 37/015* (2013.01); *H10P 74/238* (2026.01)

(58) Field of Classification Search
CPC ... B24B 37/005; B24B 37/013; B24B 37/015; B24B 7/228; H10P 74/203; H10P 74/238
See application file for complete search history.

(56) References Cited

U.S. PATENT DOCUMENTS 6,231,425 B1 * 5/2001 Inaba ...................... B24B 49/16
451/287
2002/0076933 A1 * 6/2002 Kawamura ............. H01L 22/20
438/691

(Continued)

FOREIGN PATENT DOCUMENTS

CN 111571424 A 8/2020
JP H10-128655 A 5/1998

(Continued)

OTHER PUBLICATIONS

International Search Report issued in WIPO Patent Application No. PCT/JP2022/008115, dated May 17, 2022, along with an English translation thereof.

(Continued)

*Primary Examiner* — Nathaniel E Wiehe
*Assistant Examiner* — Jackson N Gillenwaters
(74) *Attorney, Agent, or Firm* — Greenblum & Bernstein, P.L.C.

(57) ABSTRACT

A method of creating a correlation relational formula for determining a polishing condition, the method including polishing semiconductor wafers under a plurality of polishing conditions including a plurality of polishing parameters, and acquiring, by actual measurement, in-plane polishing amount distribution information on the semiconductor wafers in polishing under the plurality of polishing conditions; polishing semiconductor wafers under a plurality of polishing conditions including a plurality of polishing parameters, and acquiring, by actual measurement, in-plane temperature distribution information during semiconductor (Continued)

wafer polishing in polishing under the plurality of polishing conditions, or creating in-plane temperature distribution information during semiconductor wafer polishing under polishing conditions including a plurality of polishing parameters by heat transfer analysis, and correlating relational formulas between a semiconductor wafer in-plane temperature distribution parameter and a plurality of polishing parameters.

10 Claims, 4 Drawing Sheets

(56) References Cited

U.S. PATENT DOCUMENTS

| | | | |
|---|---|---|---|
| 2005/0245169 A1* | 11/2005 | Morisawa | B24B 37/042 |
| | | | 451/41 |
| 2007/0135020 A1 | 6/2007 | Nabeya | |
| 2008/0169571 A1 | 7/2008 | Izumi | |
| 2009/0170320 A1 | 7/2009 | Heinrich et al. | |
| 2015/0255357 A1 | 9/2015 | Kobayashi et al. | |

| | | | |
|---|---|---|---|
| 2020/0114488 A1 | 4/2020 | Tanaka et al. | |
| 2020/0262023 A1 | 8/2020 | Fujii et al. | |

FOREIGN PATENT DOCUMENTS

| | | |
|---|---|---|
| JP | 2007-181910 A | 7/2007 |
| JP | 2008-177266 A | 7/2008 |
| JP | 2015-168015 A | 9/2015 |
| JP | 2018-186118 A | 11/2018 |
| JP | 2020-109839 A | 7/2020 |
| JP | 2020-131353 A | 8/2020 |
| TW | 201128694 A1 | 8/2011 |

OTHER PUBLICATIONS

Office Action issued in TAIWAN Counterpart Patent Appl. No. 11220126100, dated Feb. 8, 2023.
International Preliminary Report on Patentability issued in Corresponding International Patent Application No. PCT/JP2022/008115, dated Nov. 14, 2023, along with an English translation thereof.
Office Action issued in Corresponding TW Patent Application No. 111108999, dated Feb. 8, 2023, along with an English translation thereof.

* cited by examiner

— Expected value r=0mm
· Actual measurement value r=0mm

— Expected value r=50mm
, Actual measurement value r=50mm

— Expected value r=100mm
. Actual measurement value r=100mm

— Expected value r=150mm
. Actual measurement value r=150mm

Fig. 7

— Expected value r=160mm
. Actual measurement value r=160mm

METHOD OF CREATING CORRELATION RELATIONAL FORMULA FOR DETERMINING POLISHING CONDITION, METHOD OF DETERMINING POLISHING CONDITION, AND SEMICONDUCTOR WAFER MANUFACTURING METHOD

CROSS REFERENCE TO RELATED APPLICATIONS

This application claims the benefit of priority to Japanese Patent Application No. 2021-079616 filed on May 10, 2021, which is expressly incorporated herein by reference in its entirety.

TECHNICAL FIELD

The present invention relates to a method of creating a correlation relational formula for determining a polishing condition, a method of determining a polishing condition, and a semiconductor wafer manufacturing method.

BACKGROUND ART

A semiconductor wafer manufacturing process usually includes a polishing step (see, for example, Japanese Patent Application Publication No. 2018-186118, which is expressly incorporated herein by reference in its entirety).

SUMMARY OF INVENTION

In a semiconductor wafer polishing step, a semiconductor wafer is polished under a predetermined polishing condition. However, the polishing condition to be determined usually includes a plurality of items. Conventionally, numerous trials and errors have to be repeated to determine these items.

With the foregoing in view, an object of one aspect of the present invention is to provide novel means that makes it possible to determine a polishing condition for a semiconductor wafer without numerous trials and errors.

One aspect of the present invention relates to a method of creating a correlation relational formula for determining a polishing condition (hereinafter, also referred to as "relational formula creation method"), the method including:

polishing semiconductor wafers under a plurality of polishing conditions including a plurality of polishing parameters, and acquiring, by actual measurement, in-plane polishing amount distribution information on the semiconductor wafers in polishing under the plurality of polishing conditions;

polishing semiconductor wafers under a plurality of polishing conditions including a plurality of polishing parameters, and acquiring, by actual measurement, in-plane temperature distribution information during semiconductor wafer polishing in polishing under the plurality of polishing conditions, or creating in-plane temperature distribution information during semiconductor wafer polishing under polishing conditions including a plurality of polishing parameters by heat transfer analysis;

creating correlation relational formula 1 between a semiconductor wafer in-plane temperature distribution parameter and a plurality of polishing parameters on the basis of the in-plane temperature distribution information during polishing;

creating correlation relational formula 2 between a semiconductor wafer in-plane polishing amount distribution parameter and a plurality of polishing parameters on the basis of the in-plane polishing amount distribution information; and creating correlation relational formula 3 between a semiconductor wafer in-plane polishing amount distribution parameter and a plurality of polishing parameters on the basis of the correlation relational formula 1 and the correlation relational formula 2, wherein the correlation relational formula 3 is a correlation relational formula to be used to determine a polishing condition in semiconductor wafer actual polishing.

According to the above relational formula creation method, the correlation relational formula (correlation relational formula 3) used for determining the polishing conditions in actual polishing of the semiconductor wafer can be created by performing the various steps described above. That is, the correlation relational formula 3 can be determined without numerous trials and errors. Furthermore, the present inventor speculates, without placing limitation on the present invention, that the correlation relational formula 3 determined in such a way has been determined by taking into consideration the degree of influence of various polishing parameters on the basis of information acquired by actual measurement and/or information created by heat transfer analysis as described above, and therefore can be expected to contribute to the determination of the polishing condition under which semiconductor wafers can be polished with high accuracy.

In one embodiment, the above temperature distribution parameter may be a difference (Tmax−Tmin) between the in-plane maximum temperature Tmax and the in-plane minimum temperature Tmin.

In one embodiment, the above in-plane polishing amount distribution parameter may be a difference (Qmax−Qmin) between the in-plane maximum polishing amount Qmax and the in-plane minimum polishing amount Qmin.

In one embodiment, the above polishing parameters may be selected from the group consisting of polishing time $\tau$, polishing slurry flow rate f, polishing pressure P, and surface plate/polishing head rotation speed $\omega$.

In one embodiment, the above correlation relational formula 1 may be $$\Delta T = X_1 + X_2 T + X_3 P + X_4 \omega + X_5 f$$

$\Delta T$ is a difference between the in-plane maximum temperature Tmax and the in-plane minimum temperature Tmin, $\tau$ is a polishing time, f is a polishing slurry flow rate, P is a polishing pressure, and $\omega$ is a surface plate/polishing head rotation speed. $X_1$, $X_2$, $X_3$, $X_4$ and $X_5$ are constants determined by correlation analysis.

In one embodiment, the correlation relational formula 2 may be $$\Delta Q / \Delta T = Y_1 + Y_2 T + Y_3 P + Y_4 \omega + Y_5 f$$

$\Delta Q$ is a difference between the in-plane maximum polishing amount Qmax and the in-plane minimum polishing amount Qmin, $\tau$ is a polishing time, f is a polishing slurry flow rate, P is a polishing pressure, $\omega$ is a surface plate/ polishing head rotation speed. $Y_1$, $Y_2$, $Y_3$, $Y_4$ and $Y_5$ are constants determined by correlation analysis.

In one embodiment, the correlation relational formula 3 may be $$\Delta Q = (X_1 + X_2 T + X_3 P + X_4 \omega + X_5 f) \times (Y_1 + Y_2 T + Y_3 P + Y_4 \omega + Y_5 f).$$

Another aspect of the present invention relates to a method of determining a polishing condition, the method including:

creating a correlation relational formula for determining a polishing condition by the above relational formula creation method;

setting a target value or target range for in-plane polishing amount distribution of a semiconductor wafer to be polished; and determining, by the above correlation relational formula, a polishing condition under which the set target value or target range can be expected to be achieved.

Yet another aspect of the present invention relates to a semiconductor wafer manufacturing method including:

determining a polishing condition by the above method of determining a polishing condition; and polishing a semiconductor wafer under the determined polishing condition.

In one embodiment, the above semiconductor wafer may be a silicon wafer.

According to one aspect of the present invention, it is possible to determine the polishing condition for semiconductor wafers without numerous trials and errors.

BRIEF DESCRIPTION OF DRAWINGS

Figure 7:
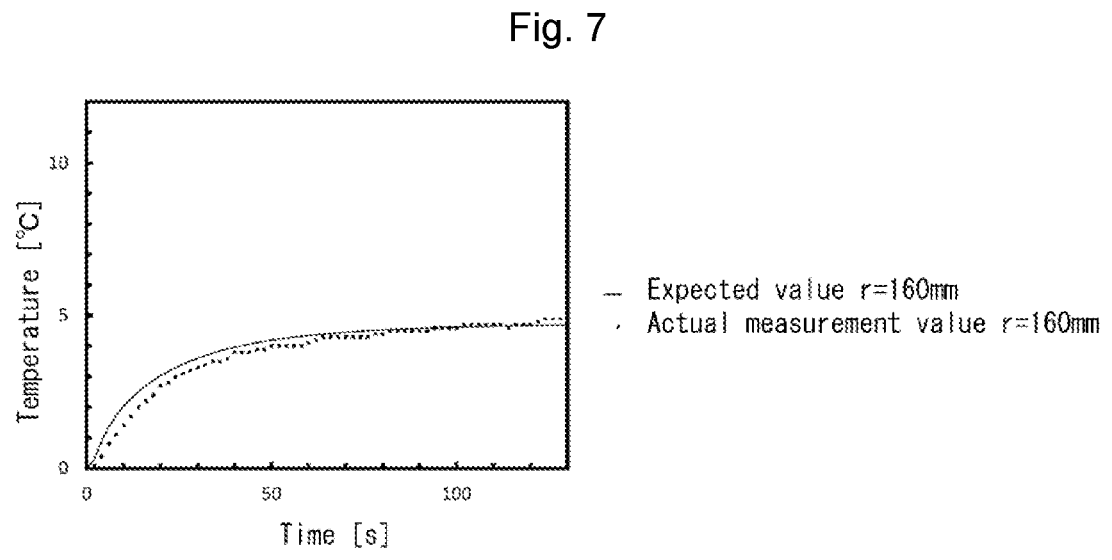

FIG. 7 is a graph (r=160 mm) in which temperature values calculated by the heat transfer analysis model are compared with actual temperature values.

DESCRIPTION OF EMBODIMENTS

[Relational Formula Creation Method]

The above relational formula creation method will be described hereinbelow in more detail.

The correlation relational formula 3 finally created by the above relational formula creation method is used to determine the polishing condition in semiconductor wafer actual polishing. In the present invention and this description, "actual polishing" means polishing performed in the process of manufacturing semiconductor wafers to be shipped as products. However, semiconductor wafers manufactured through such actual polishing are not limited to semiconductor wafers that are actually shipped as products and distributed in the market, and may also be semiconductor wafers that are determined to be defective for some reason and are excluded from the wafer group that is shipped as products. Polishing methods for polishing the surface of a semiconductor wafer include single-sided polishing for polishing one side of the wafer and double-sided polishing for polishing both sides of the wafer. Usually, in a single-sided polishing apparatus, a polishing head and a surface plate are rotated and the surface to be polished of the wafer and the polishing pad are brought into sliding contact with each other while pressing the surface to be polished of the wafer that is held by the polishing head against the polishing pad attached to the surface plate. By supplying an abrasive between the surface to be polished and the polishing pad, which are in sliding contact with each other, one surface of the wafer (the surface to be polished) can be polished. The correlation relational formula created by the above relational formula creation method can be used to determine the polishing conditions for performing single-sided polishing as the semiconductor wafer actual polishing.

<Example of Semiconductor Wafer Polishing Apparatus>

Figures 1, 2:
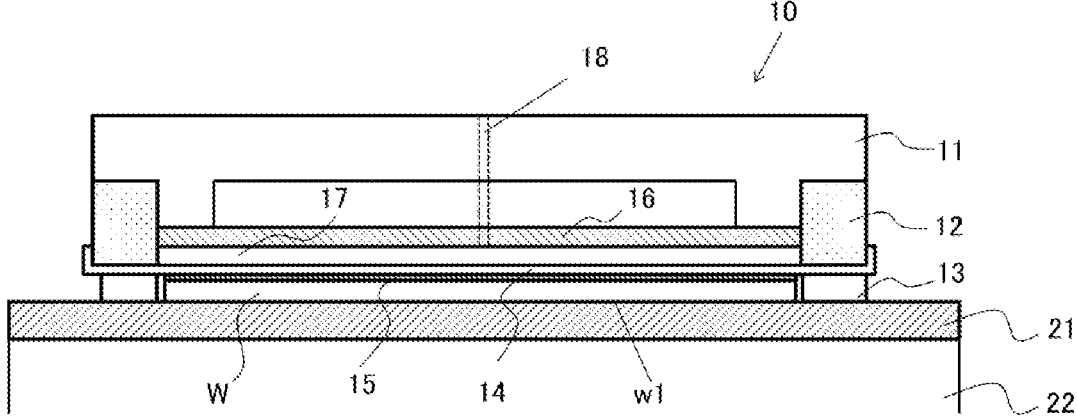
FIG. 1 is a schematic cross-sectional view showing an example of a semiconductor wafer polishing apparatus (single-sided polishing apparatus).
FIG. 2 is a schematic cross-sectional view of a polishing head 10 of the polishing apparatus shown in FIG. 1.
Figures 3, 4:
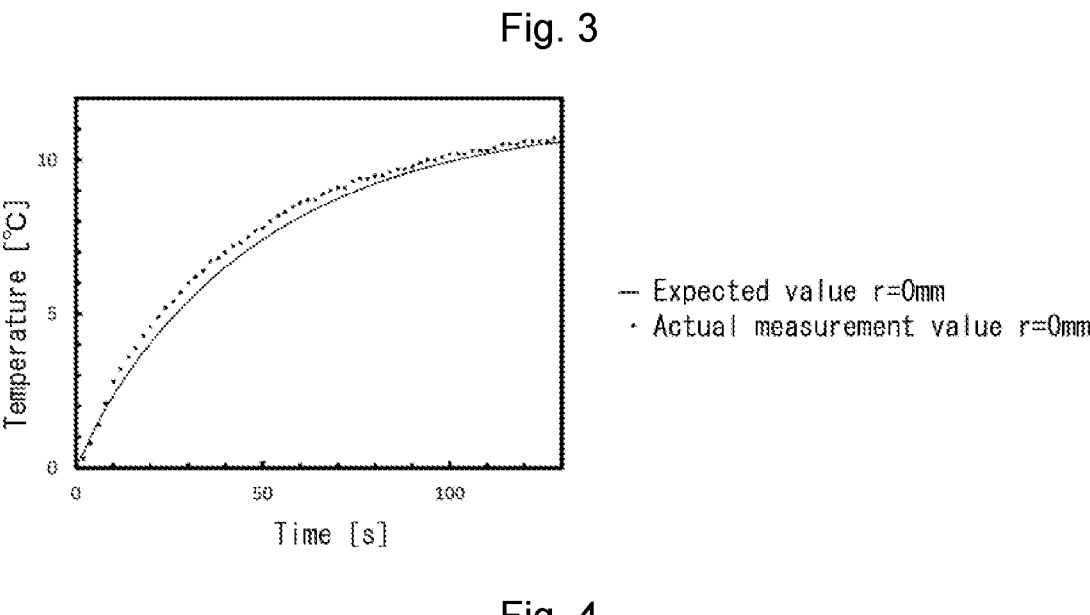
FIG. 3 is a graph (r=0 mm) in which temperature values calculated by the heat transfer analysis model are compared with actual temperature values.
FIG. 4 is a graph (r=50 mm) in which temperature values calculated by the heat transfer analysis model are compared with actual temperature values.
Figures 5, 6:
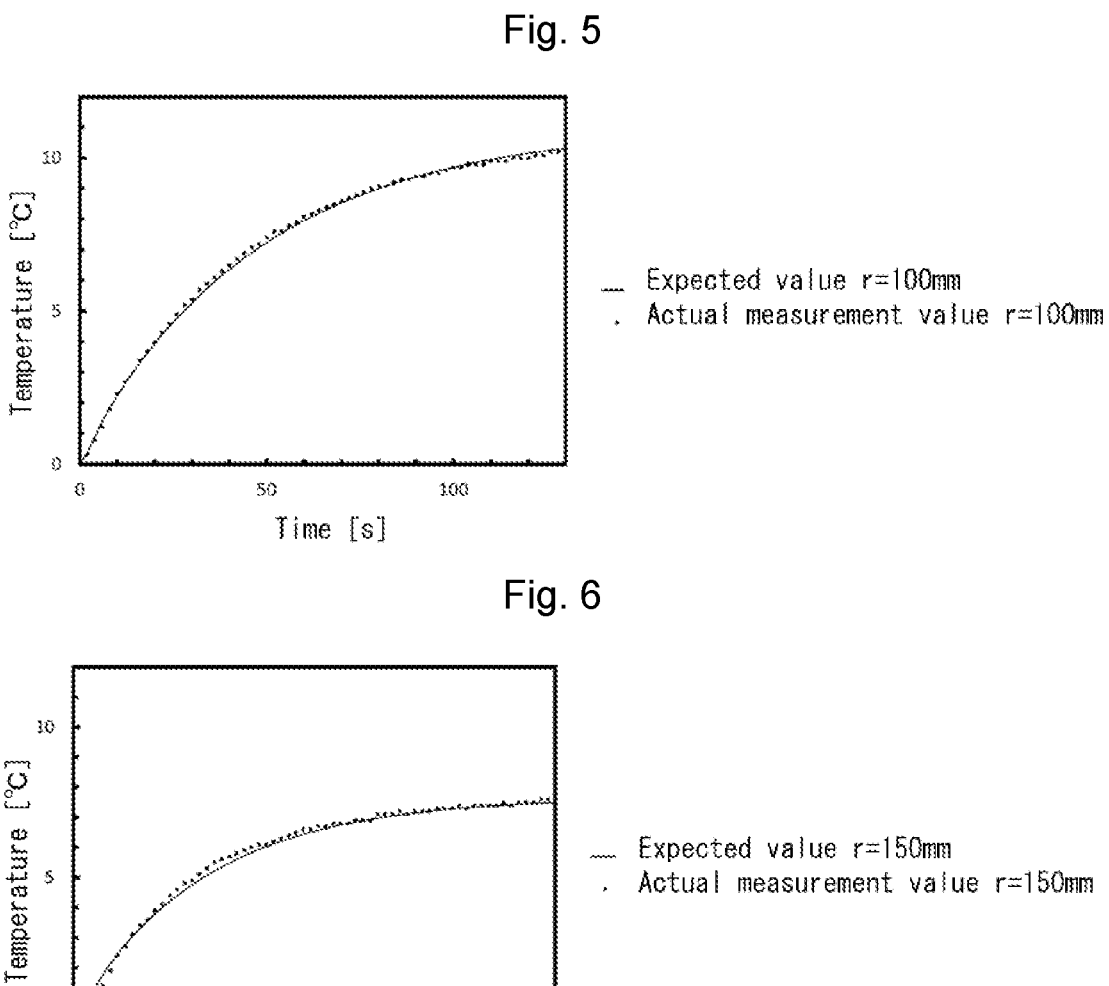
FIG. 5 is a graph (r=100 mm) in which temperature values calculated by the heat transfer analysis model are compared with actual temperature values.
FIG. 6 is a graph (r=150 mm) in which temperature values calculated by the heat transfer analysis model are compared with actual temperature values.

FIG. 1 is a schematic cross-sectional view showing an example of a semiconductor wafer polishing apparatus (single-sided polishing apparatus). In a semiconductor wafer polishing apparatus 30 shown in FIG. 1, the surface to be polished of the semiconductor wafer (also simply referred to as "wafer") W and a polishing pad 21 attached to a surface plate 22 are brought into sliding contact while rotating a polishing head 10 and the surface plate 22 by respective rotating mechanisms (not shown). An abrasive 41 discharged from an abrasive supply mechanism 40 is supplied between the surface to be polished of the wafer W and the polishing pad 21, and the surface to be polished of the wafer W is polished. As the abrasive, polishing slurry that is normally used for CMP (Chemical Mechanical Polishing) can be used.

FIG. 2 is a schematic cross-sectional view of the polishing head 10 of the polishing apparatus shown in FIG. 1. In the single-sided polishing apparatus, a rubber chuck method can be used as a method of pressing the wafer held by the polishing head against the polishing pad. The polishing head 10 shown in FIG. 2 is of the rubber chuck type. In the rubber chuck type polishing head, air or the like is introduced into the space behind a membrane to inflate the membrane so that the wafer can be pressed through the back pad positioned below the membrane.

In the polishing head 10 shown in FIG. 2, a rigid ring 12 is connected to a head body 11. The lower surface of the rigid ring 12 is covered with a membrane 14. Furthermore, a back pad 15 is attached to the lower surface of the membrane 14. A space 17 is formed behind the membrane 14 by closing the opening of the rigid ring 12 with an intermediate plate 16 and the membrane 14. By introducing a gas such as air into the space 17 from a gas introduction path 18 to inflate the membrane 14, the wafer W held at the opening of the retainer ring 13 can be pressed through the back pad 15. The pressed wafer W is pressed against the polishing pad 21 attached to the surface plate 22. A surface w1 to be polished of the wafer W and the polishing pad 21 are brought into sliding contact with each other by rotating the polishing head 10 and the surface plate 22 by respective rotating mechanisms (not shown). The surface w1 to be polished of the wafer W can thus be polished.

<Object to be Polished>

The object to be polished under the polishing condition determined using the correlation relational formula determined by the above relational formula determination method is a semiconductor wafer, for example, can be a silicon wafer (preferably a single crystal silicon wafer). For example, a silicon wafer can be produced by the following method. A silicon single crystal ingot is pulled up by the Czochralski method, and the produced ingot is cut to obtain a block. The resulting block is sliced into wafers. Silicon wafers can be produced by subjecting these wafers to various types of processing. Examples of the processing include chamfering, flattening (lapping, grinding, polishing), and the like. Polishing under the polishing condition determined using the correlation relational formula determined by the above relational formula determination method includes, for example, finish polishing, which is the final step of wafer processing described above.

Next, various steps performed in the above relational formula creation method will be described.

<Acquisition of In-Plane Polishing Amount Distribution Information>

In the above relational formula creation method, semiconductor wafers are polished under a plurality of polishing conditions including a plurality of polishing parameters, and in-plane polishing amount distribution information of the semiconductor wafers in the polishing under these plurality of polishing conditions is acquired by actual measurement. That is, the wafers are actually polished, and the polishing amount at each in-plane portion of the polished wafer surface is actually measured. Wafers to be polished under various polishing conditions can be, for example, wafers cut from the same ingot and processed to have the same wafer diameter and the same thickness. However, this example is not limiting. The polishing parameters can be various numerical values that make up the polishing conditions. Examples of the plurality of polishing parameters described above include polishing time $\tau$, polishing slurry flow rate f, polishing pressure P, and surface plate/polishing head rotation speed $\omega$. Units for various polishing parameters are not particularly limited and may be units that are commonly used for these parameters. Assuming that the rotation speed of the surface plate is $\omega 1$ and the rotation speed of the polishing head is $\omega 2$, in a usual semiconductor wafer polishing apparatus, $\omega 1$ and $\omega 2$ can be set independently, and can be set to the same value or different values. In the present invention and in this description, the "surface plate/polishing head rotation speed $\omega$" means the rotation speed of the surface plate and the rotation speed of the polishing head when $\omega 1 = \omega 2$.

As an example, silicon wafers were polished under various polishing conditions shown in Table 1 by using the semiconductor wafer polishing apparatus shown in FIG. 1. The wafers polished under various polishing conditions were cut from the same silicon single crystal ingot and processed to have the same wafer diameter (300 mm in diameter) and the same thickness (775 μm in thickness). After polishing, the wafer thickness (thickness after polishing) was measured at a plurality of points in the plane of the polished surface of each wafer. The wafer thickness can be measured by any known contactless or contact thickness measurement method. By subtracting the thickness at each point after polishing from the thickness of the wafer before polishing, the polishing amount was calculated for the plurality of points. As the wafer thickness before polishing, a design value at the time of wafer manufacture may be used, or a measured value at an arbitrary point or an arithmetic average of measured values at a plurality of arbitrary points on the wafer before polishing may be used. Let the maximum value of the polishing amount calculated for each wafer polished under each polishing condition be the in-plane maximum polishing amount Qmax, and the minimum be the in-plane minimum polishing amount Qmin. $\Delta Q$ obtained as the difference (Qmax−Qmin) therebetween is shown in Table 1. $\Delta Q$ obtained in such a way is an example of in-plane polishing amount distribution information. In Table 1, the units of various polishing parameters are arbitrary units. The polishing pressure P is the surface pressure applied to the surface of the wafer to be polished, and is a calculated value obtained by pressure calculation (finite element method) using ABAQUS manufactured by Dassault Systèmes. $\Delta T$ in Table 1 will be described hereinbelow.

TABLE 1

| Polishing parameters | | | | | |
|---|---|---|---|---|---|
| Polishing time $\tau$ | Polishing pressure P | Surface plate/ polishing head rotation speed $\omega$ | Polishing slurry flow rate f | Temperature difference $\Delta T$ (° C.) | Polishing amount difference $\Delta Q$ (nm) |
| 0.46 | 1.00 | 1.00 | 1.00 | 0.45 | 31.78 |
| 0.69 | 1.00 | 1.00 | 1.00 | 0.57 | 51.95 |
| 1.00 | 1.00 | 1.00 | 1.00 | 0.65 | 59.19 |
| 1.54 | 0.50 | 1.00 | 1.00 | 0.37 | 76.39 |
| 0.81 | 1.50 | 1.00 | 1.00 | 0.75 | 49.09 |
| 1.00 | 1.00 | 1.00 | 0.50 | 0.66 | 58.53 |
| 1.00 | 1.00 | 1.00 | 1.88 | 0.62 | 52.54 |
| 1.31 | 1.00 | 0.50 | 1.00 | 0.34 | 45.69 |
| 0.62 | 1.00 | 1.50 | 1.00 | 0.76 | 49.25 |

<Acquisition or Creation of In-Plane Temperature Distribution Information During Polishing>

In the above relational formula creation method, semiconductor wafers are polished under polishing conditions including a plurality of polishing parameters, and in-plane temperature distribution information during polishing of the semiconductor wafers in polishing under these plurality of polishing conditions is acquired by actual measurement, or in-plane temperature distribution information during polishing of the semiconductor wafers in polishing under polishing conditions including a plurality of polishing parameters is created by heat transfer analysis.

In one embodiment, semiconductor wafers are polished under polishing conditions including a plurality of polishing parameters, and in-plane temperature distribution information during polishing of the semiconductor wafers in polishing under these plurality of polishing conditions is acquired by actual measurement. That is, the wafers are actually polished, and information about the temperature of each in-plane portion of the wafer surface during polishing is acquired by actual measurement. The temperature actually measured here can be the temperature at a position near the surface to be polished of the wafer being polished or the temperature itself of the surface to be polished of the wafer being polished. Normally, it is not easy to measure the surface temperature itself of the wafer surface being polished in sliding contact with a polishing pad. Therefore, the temperature actually measured here is preferably the temperature at a position near the surface to be polished of the wafer being polished. For example, in the semiconductor wafer polishing apparatus shown in FIG. 1, the temperature of each in-plane portion of a member (for example, membrane 14, back pad 15, or the like) positioned above the wafer to be polished can be actually measured during wafer polishing, and the measured result can be adopted as in-plane temperature distribution information during wafer polishing.

For example, when silicon wafers are polished under various polishing conditions shown in Table 1 by the semiconductor wafer polishing apparatus shown in FIG. 1 in order to determine $\Delta Q$, the temperature at a position near to the surface to be polished of the wafer during polishing can condition that expresses heat flux for slurry cooling and uses Newton's cooling law) are taken as experimental parameters. These are functions of the distance r from the wafer center and the polishing parameters (polishing time $\tau$, polishing pressure P, surface plate/polishing head rotation speed $\omega$, slurry flow rate f). Here, the units of values of the polishing parameters are arbitrary units. The functions thus determined by the above model are shown below.

$$\mu(\tau, P, \omega, f) = 0.3 \qquad \text{[Math. 1]}$$

$$h(r, \tau, P, \omega, f) =$$

$$\begin{cases} \left(9.42\omega^{0.45}(0.01f + 34.62)\right)^{0.5} & 0 \le r \le 150 \text{ (Wafer region)} \\ \left(142.41\omega^{0.41}(10.23f + 414.44)\right)^{0.5} & r > 150 \text{ (Polishing head region)} \end{cases} \text{Arbitrary units}$$

be measured. For example, in order to actually measure the temperature near the surface of the wafer during polishing, thermocouple wires with wireless devices can be inserted at a plurality of points between the membrane and the back pad before polishing is started, and the temperature at each location during polishing can be measured with these thermocouples. During polishing under each polishing condition, the temperatures at the plurality of locations are continuously measured, the maximum value among the measurement results is taken as the in-plane maximum temperature Tmax, the minimum value is taken at the in-plane minimum temperature Tmin, and $\Delta T$, which is the difference (Tmax−Tmin), can be calculated. $\Delta T$ thus calculated is an example of in-plane temperature distribution information during polishing. In the above example, the in-plane temperature distribution information during polishing is acquired during polishing for acquiring the in-plane polishing amount distribution information. However, the above relational formula determination method is not limited to this example. For example, polishing may be performed separately from the polishing for acquiring the in-plane polishing amount distribution information, and the temperature for acquiring the in-plane polishing amount distribution information during polishing can be also actually measured during such separate polishing. Further, the plurality of polishing conditions for performing polishing for acquiring the in-plane polishing amount distribution information may be the same as the plurality of polishing conditions for acquiring the in-plane temperature distribution information during polishing, or one or more or all of the polishing conditions may be different polishing conditions.

Further, in one embodiment, heat transfer analysis can be used to create in-plane temperature distribution information during polishing of semiconductor wafers in polishing under polishing conditions including a plurality of polishing parameters.

For example, as a heat transfer analysis model, a model in which the heat conduction equation is solved using general-purpose finite element method (FEM) analysis software Abaqus can be employed. By using such a heat transfer analysis model, it is possible to predict the temperature of the wafer surface during polishing, which is usually not easy to measure.

In the above model, a dynamic friction coefficient $\mu$ used for frictional heat generation (heat flux boundary condition that expresses frictional heat flux) and a heat transfer coefficient h using slurry heat removal (heat flux boundary FIGS. 3 to 7 are graphs in which the temperature values calculated by the heat transfer analysis model and the actually measured temperature values are compared with each other. Specifically, FIGS. 3 to 7 are graphs in which predicted values of temperature at each location calculated from the heat transfer analysis model are compared with actually measured values obtained by actually measuring the temperature at each location by the above-described method by actually performing polishing under the same polishing conditions. Where the distance from the wafer center is denoted by r, the actual measurements were performed at the following five locations: the position directly above the wafer center (r=0 mm), the position directly above the position 50 mm radially outward from the wafer center (r=50 mm), the position directly above the position 100 mm radially outward from the wafer center (r=100 mm), the position directly above the position 150 mm radially outward from the wafer center (r=150 mm), and the position directly above the position 160 mm radially outward from the wafer center (r=160 mm). From the graphs shown in FIGS. 3 to 7, it can be confirmed that, with the heat transfer analysis model, the temperature of the surface to be polished of the wafer being polished (specifically, the membrane temperature, more specifically, the temperature between the membrane and the back pad) can be predicted with a difference with the measured value of 0.5° C. or less. Therefore, in the above relational formula creation method, the in-plane temperature distribution information during polishing of a semiconductor wafer in polishing under polishing conditions including a plurality of polishing parameters can also be created by heat transfer analysis without the need for actual measurement. For example, $\Delta T$, which is the difference (Tmax−Tmin) between the in-plane maximum temperature Tmax and the in-plane minimum temperature Tmin, can be calculated from the prediction results. $\Delta T$ thus obtained is an example of the in-plane temperature distribution information during polishing. $\Delta T$ shown in Table 1 is a value obtained by using the heat transfer analysis model to calculate $\Delta T$ for the case of polishing silicon wafers under various polishing conditions shown in Table 1 with the semiconductor wafer polishing apparatus shown in FIG. 1 to obtain $\Delta Q$. The temperature was predicted for a distance r=0 to 148 mm from the wafer center, and $\Delta T$ was calculated with the maximum value among the predicted values as Tmax and the minimum value as Tmin. In the above example, the heat transfer analysis model is applied to the polishing conditions for acquiring the in-plane polishing amount distribution information. However, the above relational formula determination method is not limited to this example. The plurality of polishing conditions for performing polishing for acquiring in-plane polishing amount distribution information may all be the same as the plurality of polishing conditions for creating in-plane temperature distribution information during polishing by heat transfer analysis, or one or more or all of polishing conditions may be different.

From the results shown in Table 1, it can be said that there is a high correlation between $\Delta T$ and polishing conditions as well as between $\Delta Q$ and polishing conditions.

<Creation of Correlation Relational Formula 1>

The correlation relational formula 1 is a correlation relational formula between the in-plane temperature distribution parameters and a plurality of polishing parameters of a semiconductor wafer and can be created based on the in-plane temperature distribution information during polishing acquired or created hereinabove. For example, the correlation relational formula 1 can be "Formula 1: $\Delta T=X_1+X_2\tau+X_3P+X_4\omega+X_5f$". Here, $\Delta T$ is the difference between the in-plane maximum temperature Tmax and the in-plane minimum temperature Tmin and can be obtained as described above. $\tau$ is the polishing time, f is the polishing slurry flow rate, P is the polishing pressure, $\omega$ is the surface plate/polishing head rotation speed, and $X_1$, $X_2$, $X_3$, $X_4$ and $X_5$ are constants determined by correlation analysis, these constants having positive or negative values. Methods for correlation analysis are well known.

As an example, in the embodiment shown in Table 1, Formula 1 is obtained as Formula (1) below ($R^2=0.89$).

$$\Delta T = \max \ (T(r, t = T, P, \omega, f)) - \min(T(r, t = T, P, \omega, f)) = \quad \text{Formula (1)}$$
$$-0.59 + 0.16T + 0.49P + 0.53\omega - 0.006f$$

<Creation of Correlation Relational Formula 2>

The correlation relational formula 2 is a correlation relational formula between the in-plane polishing amount distribution parameters and a plurality of polishing parameters of a semiconductor wafer and can be created based on the in-plane polishing amount distribution information acquired above. For example, the correlation relational formula 2 can be "Formula 2: $\Delta Q/\Delta T=Y_1+Y_2\tau+Y_3P+Y_4\omega+Y_5f$". Here, $\Delta Q$ is the difference between the in-plane maximum polishing amount Qmax and the in-plane minimum polishing amount Qmin and can be obtained as described above. $\tau$ is the polishing time, f is the polishing slurry flow rate, P is the polishing pressure, $\omega$ is the surface plate/polishing head rotation speed, and $Y_1$, $Y_2$, $Y_3$, $Y_4$ and $Y_5$ are constants determined by correlation analysis, these constants having positive or negative values. As an example, in the embodiment shown in Table 1, Formula 2 is obtained as Formula (2) below ($R^2=0.91$).

$$\Delta Q/\Delta T = \Delta Q(T, P, \omega, f)/\Delta T(T, P, \omega, f) = \quad \text{Formula (2)}$$
$$146.46 - 74.82T - 86.82P - 19.62\omega - 9.76f$$

<Creation of Correlation Relational Formula 3>

The correlation relational formula 3 is a correlation relational formula used for determining the polishing condition in semiconductor wafer actual polishing and can be created based on the correlation relational formula 1 and the correlation relational formula 2. For example, when the correlation relational formula 1 is the above Formula 1 and the correlation relational formula 2 is the above Formula 2, "Formula 3: $\Delta Q=(X_1+X_2\tau+X_3P+X_4\omega+X_5f)\times(Y_1+Y_2\tau+Y_3P+Y_4\omega+Y_5f)$" can be derived from Formula 1 and Formula 2. In Formula 3, $X_1$ to $X_5$, $Y_1$ to $Y_5$, $\tau$, f, P, and $\omega$ have the same meanings as above. For example, the correlation relational formula 3 can be Formula 3 above. As an example, in the embodiment shown in Table 1, Formula 3 can be derived from Formula (1) and Formula (2) above as Formula (3) below.

$$\Delta Q = (-0.59 + 0.16T + 0.49P + 0.53\omega - 0.006f) \times \quad \text{Formula (3)}$$
$$(146.46 - 74.82T - 86.82P - 19.62\omega - 9.76f)$$

A method of determining the polishing condition based on the correlation relational formula 3 will be explained below.

[Method of Determining Polishing Conditions]

One aspect of the present invention relates to a method of determining a polishing condition, the method comprising:
  creating a correlation relational formula for determining a polishing condition by the above relational formula creation method,
  setting a target value or target range for in-plane polishing amount distribution of a semiconductor wafer to be polished, and
  determining, by the above correlation relational formula, a polishing condition under which set target value or target range can be expected to be achieved.

The creation of the correlation relational formula for determining the polishing condition in the method of determining the polishing condition is as described above. Specifically, the above-described correlation relational formula 3 is the correlation relational formula for determining the polishing condition.

The correlation relational formula 3 can include $\Delta Q$, and a specific example thereof is Formula 3 described above. For example, the target value or target range of $\Delta Q$ can be set as the target value or target range of the in-plane polishing amount distribution of the semiconductor wafer to be polished. Such a target value or target range can be arbitrarily set in consideration of the flatness and the like desired for the product wafer.

After the target value or target range is set, the polishing condition (specifically, specific values of various polishing parameters) under which the correlation relational formula 3 holds between the target value, a value within the target range, or a value slightly different from the above values can be determined as the polishing condition under which set target value or target range can be expected to be achieved. A value that is slightly different from the above values can be, for example, a value of "A×0.90 to 1.10" or a value of "A×0.95 to 1.05", where A is the target value or a value within the target range.

In addition, one or more of the following items can be considered as limiting conditions when determining the polishing condition.

Limiting condition A: In order to prevent an increase in slurry cost, the slurry flow rate f is set to a predetermined value or less. For example, in the embodiment shown in Table 1, the slurry flow rate is 1.00 or less. Also, in order to supply abrasive grains sufficient for polishing, the slurry flow rate f is set to a predetermined value or more. For example, in the embodiment shown in Table 1, the slurry flow rate is 0.50 or more.

Limiting condition B: The polishing time T is set to a predetermined value or less in order to prevent an increase in throughput. For example, in the embodiment shown in Table 1, the polishing time is 1.00 or less.

Limiting condition C: In order to prevent damage to the members of the polishing head, the polishing pressure P is set to a predetermined value or less. For example, in the embodiment shown in Table 1, the polishing pressure is 2.00 or less.

Limiting condition D: In order to prevent condensation of slurry components, deterioration of the polishing pad, and thermal cracking of the surface plate, the maximum value of the temperature of the surface to be polished of the wafer being polished or in the vicinity thereof (hereinafter simply referred to as the "maximum value of temperature") is set to a predetermined value T or less. The details of the temperature of the surface to be polished of the wafer being polished or in the vicinity thereof are as described above. The predetermined value T can be obtained from "Formula 4: $T=Z_1+Z_2\tau+Z_3P+Z_4\omega+Z_5f$" by correlation analysis. $\tau$ is the polishing time, f is the polishing slurry flow rate, P is the polishing pressure, $\omega$ is the surface plate/polishing head rotation speed, and $Z_1$, $Z_2$, $Z_3$, $Z_4$ and $Z_5$ are constants determined by correlation analysis, these constants having positive or negative values. As an example, in the embodiment shown in Table 1, Formula 4 is obtained as Formula (4) below by correlation analysis ($R^2=0.92$), and the predetermined value T can be calculated as, for example, 50° C.

$$T\text{max} = 17.04 + 0.76T + 7.31P + 7.88\omega - 0.52f \qquad \text{Formula (4)}$$

Limiting condition E: In order to prevent the wafer from falling off during polishing, the surface plate/polishing head rotation speed w is set to a predetermined value or less. For example, in the embodiment shown in Table 1, the rotation speed is 1.50 or less.

For example, in the embodiment shown in Table 1, under limiting conditions A to E, when the target value of $\Delta Q$ is set to 50 nm, 100 nm, 150 nm or 200 nm, and the slurry flow rate f of limiting condition A is fixed at 1.00, various polishing conditions shown in Table 2 (Tables 2-1 to 2-4) can be determined from Formula (3) as polishing conditions that satisfy Formula (3).

The polishing conditions can be determined, for example, as follows.

(i) After setting the target value of $\Delta Q$, the slurry flow rate f is determined within a range that satisfies the limiting condition A.

(ii) Next, the surface plate/polishing head rotation speed $\omega$ is determined within a range that satisfies the limiting condition E.

(iii) After that, the polishing time t is determined within a range that satisfies the limiting condition B.

(iv) After the slurry flow rate f, the surface plate/polishing head rotation speed $\omega$, and the polishing time $\tau$ are determined in the above (i) to (iii), the determined various values are substituted into Formula (3), and the polishing pressure P is determined within a range that satisfies the limiting condition C as the value to be taken as a target value for which $\Delta Q$ has been set in Formula (3), or a value close to the target value. Among the various variables ($\tau$, P, $\omega$ and f) that make up Formula (3), the polishing pressure P is suitable as the last determined value because the polishing pressure is relatively easy to control.

In Table 2, if "OK" is entered in the limiting condition determination column, it indicates that the value on the left side in the table satisfies the limiting condition described for the embodiment shown in Table 1. The polishing conditions shown in Table 2 are examples, and there are various other polishing conditions that satisfy Formula (3).

TABLE 2-1

| Items | Values | Limiting condition determination |
|---|---|---|
| $\tau$ | 0.64 | OK |
| P | 1.50 | OK |
| $\omega$ | 1.50 | OK |
| f | 1.00 | OK |
| Maximum value of temperature (° C.) | 39.80 | OK |
| $\Delta T$(° C.) | 2.04 | — |
| $\Delta Q$(nm) | 50.95 (Target value: 50 nm) | — |

TABLE 2-2

| Items | Values | Limiting condition determination |
|---|---|---|
| $\tau$ | 0.95 | OK |
| P | 1.50 | OK |
| $\omega$ | 1.50 | OK |
| f | 1.00 | OK |
| Maximum value of temperature (° C.) | 40.03 | OK |
| $\Delta T$(° C.) | 2.09 | — |
| $\Delta Q$(nm) | 99.90 (Target value: 100 nm) | — |

TABLE 2-3

| Items | Values | Limiting condition determination |
|---|---|---|
| $\tau$ | 1.00 | OK |
| P | 1.22 | OK |
| $\omega$ | 1.50 | OK |
| f | 1.00 | OK |
| Maximum value of temperature (° C.) | 38.03 | OK |
| $\Delta T$(° C.) | 1.96 | — |
| $\Delta Q$(nm) | 149.55 (Target value: 150 nm) | — |

TABLE 2-4

| Items | Values | Limiting condition determination |
|---|---|---|
| $\tau$ | 1.00 | OK |
| P | 0.78 | OK |
| $\omega$ | 1.50 | OK |
| f | 1.00 | OK |
| Maximum value of temperature (° C.) | 34.81 | OK |
| $\Delta T$(° C.) | 1.75 | — |
| $\Delta Q$(nm) | 199.86 (Target value: 200 nm) | — |

According to the above method of determining a polishing condition, for example, the polishing condition for the semiconductor wafer can be determined according to the correlation relational formula 3 without numerous trials and errors, as described above.

13 14

[Semiconductor Wafer Manufacturing Method]

One aspect of the present invention relates to a semiconductor wafer manufacturing method including:

determining polishing conditions by the above method of determining a polishing condition, and polishing a semiconductor wafer under the determined polishing condition.

The details of determining the polishing condition in the method of manufacturing a semiconductor wafer are as described above. Polishing under the determined polishing condition can be performed, for example, in a single-sided polishing apparatus. The above-described semiconductor wafer polishing apparatus shown in FIG. 1 is an example of a single-sided polishing apparatus. For example, in the semiconductor wafer polishing apparatus shown in FIG. 1, the surface to be polished of the wafer W and the polishing pad 21 attached to the surface plate 22 are brought into sliding contact with each other while the polishing head 10 and the surface plate 22 are rotated by respective rotating mechanisms (not shown). The abrasive 41 discharged from the abrasive supply mechanism 40 is supplied between the surface to be polished of the wafer W and the polishing pad 21, and the surface to be polished of the wafer W is polished. As the abrasive, polishing slurry that is normally used for CMP (Chemical Mechanical Polishing) can be used. Known techniques relating to methods of manufacturing a semiconductor wafer having a polished surface can be applied to the above semiconductor wafer manufacturing method, except that the polishing condition is determined as described above. The wafer to be polished can be, for example, a silicon wafer (preferably a single crystal silicon wafer). For example, silicon wafers can be produced by the method described above. Polishing performed under the polishing condition determined as described above can be, for example, finish polishing, which is the final step of wafer processing.

One aspect of the present invention is useful in the technical field of semiconductor wafers such as silicon wafers.

The invention claimed is:

1. A method of creating a correlation relational formula for determining a polishing condition, the method comprising:

polishing semiconductor wafers under a plurality of polishing conditions including a plurality of polishing parameters, and acquiring, by actual measurement, in-plane polishing amount distribution information on the semiconductor wafers in polishing under the plurality of polishing conditions;

polishing semiconductor wafers under a plurality of polishing conditions including a plurality of polishing parameters, and acquiring, by actual measurement, in-plane temperature distribution information during semiconductor wafer polishing in polishing under the plurality of polishing conditions, or creating in-plane temperature distribution information during semiconductor wafer polishing under polishing conditions including a plurality of polishing parameters by heat transfer analysis;

creating correlation relational formula 1 between a semiconductor wafer in-plane temperature distribution parameter and a plurality of polishing parameters on the basis of the in-plane temperature distribution information during polishing;

creating correlation relational formula 2 between a semiconductor wafer in-plane polishing amount distribution parameter and a plurality of polishing parameters on the basis of the in-plane polishing amount distribution information; and creating correlation relational formula 3 between a semiconductor wafer in-plane polishing amount distribution parameter and a plurality of polishing parameters on the basis of the correlation relational formula 1 and the correlation relational formula 2, wherein the correlation relational formula 3 is a correlation relational formula to be used to determine a polishing condition in semiconductor wafer actual polishing.

2. The method of creating according to claim 1, wherein the in-plane temperature distribution parameter is a difference (Tmax−Tmin) between an in-plane maximum temperature Tmax and an in-plane minimum temperature Tmin.

3. The method of creating according to claim 1, wherein the in-plane polishing amount distribution parameter is a difference (Qmax−Qmin) between an in-plane maximum polishing amount Qmax and an in-plane minimum polishing amount Qmin.

4. The method of creating according to claim 1, wherein the polishing parameters are selected from the group consisting of polishing time $\tau$, polishing slurry flow rate f, polishing pressure P, and surface plate/polishing head rotation speed $\omega$.

5. The method of creating according to claim 1, wherein the correlation relational formula 1 is $$\Delta T = X_1 + X_2\tau + X_3P + X_4\omega + X_5f$$

$\Delta T$ is a difference between an in-plane maximum temperature Tmax and an in-plane minimum temperature Tmin, $\tau$ is a polishing time, f is a polishing slurry flow rate, P is a polishing pressure, and $\omega$ is a surface plate/polishing head rotation speed, and $X_1$, $X_2$, $X_3$, $X_4$ and $X_5$ are constants determined by correlation analysis.

6. The method of creating according to claim 5, wherein the correlation relational formula 2 is $$\Delta Q/\Delta T = Y_1 + Y_2\tau + Y_3P + Y_4\omega + Y_5f$$

$\Delta Q$ is a difference between an in-plane maximum polishing amount Qmax and an in-plane minimum polishing amount Qmin, $\tau$ is the polishing time, f is the polishing slurry flow rate, P is the polishing pressure, $\omega$ is the surface plate/polishing head rotation speed, and $Y_1$, $Y_2$, $Y_3$, $Y_4$ and $Y_5$ are constants determined by correlation analysis.

7. The method of creating according to claim 6, wherein the correlation relational formula 3 is $$\Delta Q = (X_1 + X_2\tau + X_3P + X_4\omega + X_5f) \times (Y_1 + Y_2\tau + Y_3P + Y_4\omega + Y_5f).$$

8. A method of determining a polishing condition, the method comprising:

creating a correlation relational formula for determining a polishing condition by method of creating according to claim 1;

setting a target value or target range for in-plane polishing amount distribution of a semiconductor wafer to be polished; and determining, by the correlation relational formula, a polishing condition under which the set target value or target range can be expected to be achieved.

9. A method of manufacturing a semiconductor wafer, the method comprising:

determining a polishing condition by the method of determining according to claim 8; and polishing a semiconductor wafer under the determined polishing condition.

10. The method of manufacturing according to claim 9, wherein the semiconductor wafer is a silicon wafer.

\*    \*    \*    \*    \*